(12) United States Patent
Kuttner (10) Patent No.: US 7,675,442 B2
(45) Date of Patent: *Mar. 9, 2010

(54) COMPENSATION OF NONLINEARITY OF SINGLE ENDED DIGITAL TO ANALOG CONVERTERS

(75) Inventor: Franz Kuttner, St. Ulrich (AT)

(73) Assignee: Infineon Technologies AG, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 12/358,254

(22) Filed: Jan. 23, 2009

(65) Prior Publication Data

US 2009/0128383 A1      May 21, 2009

Related U.S. Application Data

(63) Continuation of application No. 11/941,811, filed on Nov. 16, 2007, now Pat. No. 7,489,261.

(51) Int. Cl.
*H03M 1/66* (2006.01)

(52) U.S. Cl. .............. 341/136; 341/144; 327/382; 327/390; 323/316

(58) Field of Classification Search ........... 341/136, 341/144, 153; 327/379, 382, 389, 390, 391, 327/431, 434, 534; 323/312–317
See application file for complete search history.

(56) References Cited

U.S. PATENT DOCUMENTS

| 5,148,065 | A | * | 9/1992 | Krenik et al. ............ 327/382 |
| 5,475,323 | A | * | 12/1995 | Harris et al. ............ 327/67 |
| 5,548,238 | A | * | 8/1996 | Zhang et al. ............ 327/374 |
| 6,806,692 | B2 | * | 10/2004 | Lee ........................ 323/277 |
| 6,833,801 | B1 | * | 12/2004 | Ostrem et al. ........... 341/144 |
| 7,295,068 | B2 | * | 11/2007 | Capofreddi et al. ..... 330/254 |
| 7,307,463 | B2 | * | 12/2007 | Miyake et al. .......... 327/437 |
| 2003/0001656 | A1 | * | 1/2003 | Tucholski et al. ....... 327/393 |

* cited by examiner

*Primary Examiner*—Howard Williams
(74) *Attorney, Agent, or Firm*—SpryIP, LLC (57) ABSTRACT

This disclosure relates to a compensating for nonlinearity resulting from a capacitance feedback in current cells of a single ended digital to analog circuit.

17 Claims, 6 Drawing Sheets

Prior Art

COMPENSATION OF NONLINEARITY OF SINGLE ENDED DIGITAL TO ANALOG CONVERTERS

BACKGROUND

This application relates to regulating the output of a digital to analog converter, and more specifically to compensating for a nonlinearity of current levels generated when activating a current source transistor in a digital to analog converter.

Today, in general, Digital to Analog converters (DACs) may be implemented as current steering converters. Such converters may normally be constructed in a fully differential architecture. A differential architecture may provide an improved signal quality over a single ended architecture. Nevertheless, single ended architectures are still used, because they operate at a reduced power level compared with differential architectures.

When transmitting a signal with a differential architecture over a video line, the signal and its reflections may be dampened with low resistance. Dampening wastes power because the DAC supplies current to the video line independent of the signal. One typical DAC with a differential architecture provides an output that is strongly oversampled and may require a significant amount of power consumption.

To reduce the power consumption, single ended current DACs may be used. Single ended current DACs may include multiple cells of current generating transistors that are selectively activated. Single ended DACs may generate undesirable even harmonics that results from capacitive feedback into the gate of the current generating transistor when the cell is activated.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Disclosed herein are techniques for compensating for a nonlinearity of current levels generated when activating a current source transistor in a digital to analog converter (DAC). In one technique a digital to analog converter is provided that has many current source cells. Each of the current cells includes an output terminal, a current source transistor, a capacitance circuit and a switch. The current source transistor includes a gate terminal with a bias voltage and a source terminal. The switch connects the output terminal to the source terminal. The capacitance circuit is coupled with the output terminal and the gate terminal to compensate for capacitance feedback between the gate terminal and the source terminal when the switch is activated. In another implementation of the technique, current source is provided with an output terminal and a current source transistor coupled via a switch to the output terminal. The current source transistor has a gate terminal with a bias voltage and a source terminal. The switch connects the output terminal to the source terminal. A capacitance circuit is coupled with the output terminal and the gate terminal to compensate for capacitance feedback between the gate terminal and the source terminal when the switch is activated.

Figure 1:
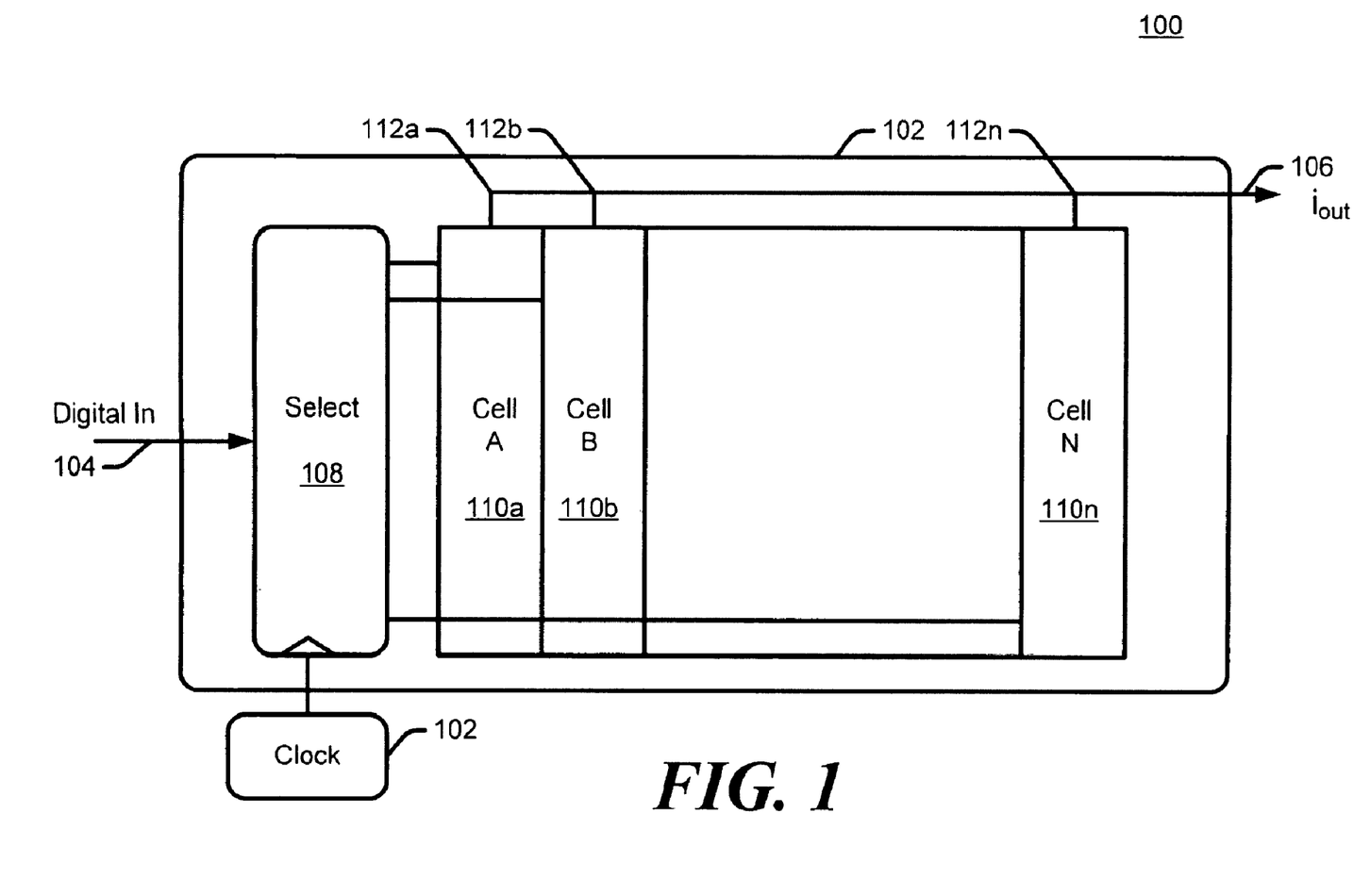
FIG. 1 is a system diagram of a digital to analog converter circuit.

FIG. 1 illustrates a DAC 100 coupled with a high speed digital clock 102. DAC 100 may include one or more digital input terminal(s) 104 and an output terminal 106 (the signal on the output terminal may herein be designated as "$i_{out}$"). Digital input terminal(s) 104, may simultaneously receive multiple digital input signals from a digital controller device (not shown), examples of which may include a state machine or a microprocessor. The input signals are clocked into DAC 100 using the high speed digital clock 102. The DAC 100 may then provide a voltage or current signal $i_{out}$ on output terminal 106 corresponding to the digital input signal.

DAC 100 includes a selection logic circuit connected to current source cells A 110a-current cell N 110n. Each of current cells 110 (a-n) has a respective output terminal 112 (a-n). Selection circuit 108 activates each of current source cells 110(a)-(n), in response to selection circuit 108 clocking through the digital signals on digital input terminal(s) 104. Cell A 110(a)-cell N 110(n) are respectively connected to output terminals 112 (a-n), which are connected together to output terminal 106. The current provided by each of cells 10(a)-10(n) may be set by a bias level of a transistor in each of the cells. Each of cells 110(a)-110(n) may be configured to supply a different current or voltage level such that the each cells may be selectively activated based on the digital input signal on digital input terminal(s) 104.

Figure 2:
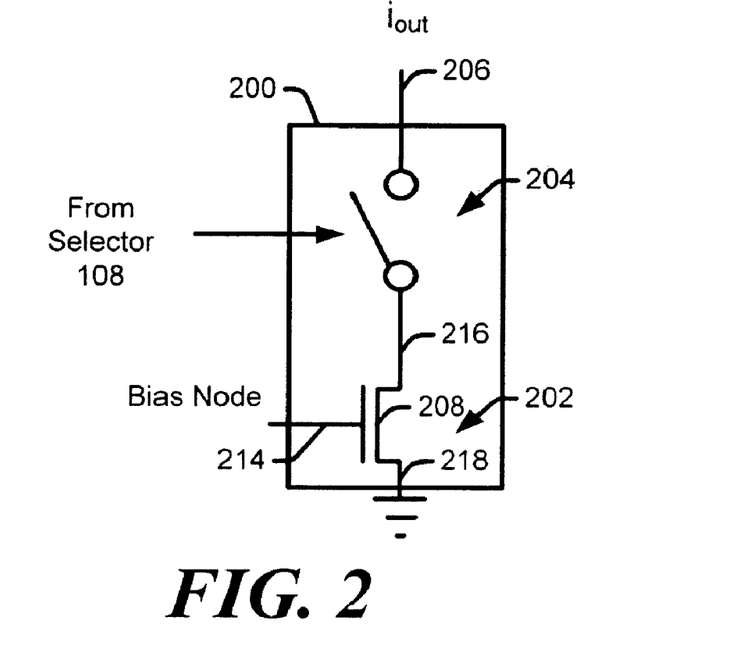
FIG. 2 is a circuit diagram of a current source used in a single ended digital to analog converter circuit.

FIG. 2 shows an exemplary single cell 200 (individually designated as cells 10(a)-10(n) in FIG. 1) that is a single ended current source. Cell 200 includes a current source 202 connected through switch 204 to output terminal 206. In one implementation, cell 200 includes current source transistor 208 connected to output terminal 206 ($i_{out}$) via switch 204. Transistor 208 may be a field effect transistor (FET) type transistor with a gate terminal 214 (also referred to herein as a Bias Node), source terminal 216, and drain terminal 218. Gate terminal 214 has a voltage level set by a bias transistor (not shown). Drain terminal 218 is coupled with a ground node. Switch 204, which is coupled to source terminal 216, opens and closes in response to being selected by selection circuit 108 (FIG. 1). Switch 204 may be another FET transistor or any device that does not limit the current being sourced by current source transistor 208.

Figure 3:
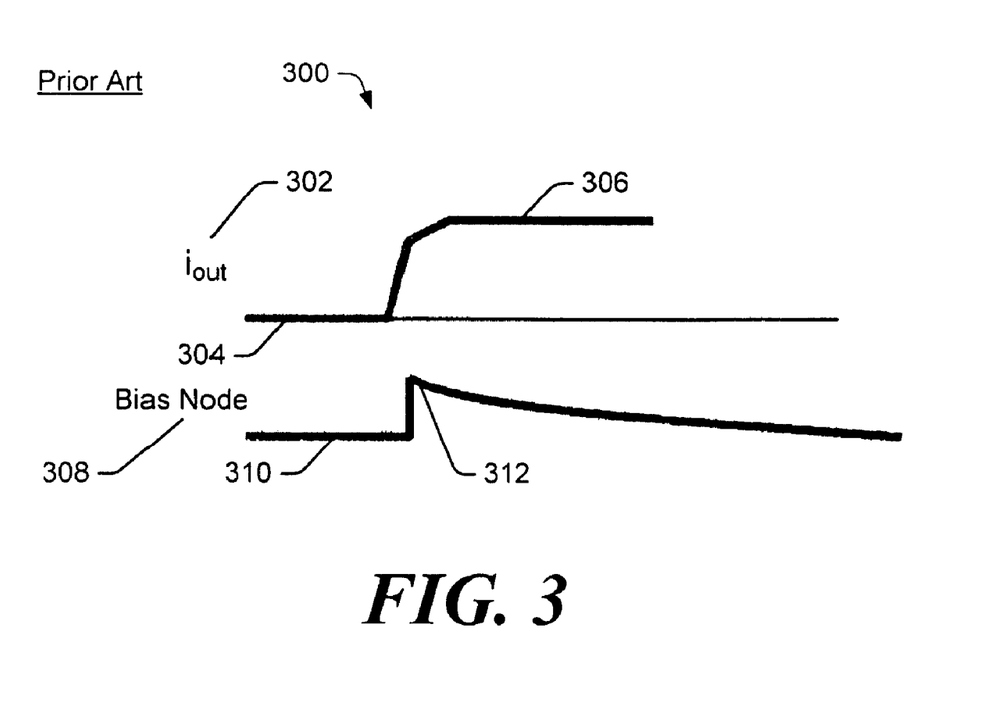
FIG. 3 is a timing diagram illustrating activation of an output ($i_{out}$) signal and the effect of the activation on a bias node in a single ended digital to analog converter circuit.

FIG. 3, shows a timing diagram 300 illustrating the voltage levels on bias node 214 when switch 204 is activated. Specifically, when switch 204 is activated, the current level $i_{out}$ 302 across transistor 208 rises from level 304 to level 306. Subsequently, due to capacitance feedback transferred to the bias node 214, the voltage level 308 on bias node 214 responds to the increase in current by instantaneously increasing from level 310 to level 312. It has been observed that when switch 204 is switched off and on at a high rate, a distortion occurs on output terminal 206. If a sine wave is generated with a DAC using the single ended transistors, the voltage of the bias node 214 is modulated with a sine wave due to this effect. Thus by increasing the current of the DAC, the bias voltage is increased. Also by decreasing the current, the bias voltage on bias node 214 is decreased. This effect results in odd order harmonics on output terminal 206 that is amplified by an increase in the on/off frequency of the switch 204.

In one described implementation, the distortion resulting from the capacitive effect is reduced by compensating for a capacitive coupling across the source transistor. This compensation is provided by coupling another capacitive coupling across the source and gate of the source transistor in the opposite direction. Disclosed herein are techniques for providing a capacitive coupling across the source transistor to compensate for capacitive coupling effects.

The techniques described herein may be implemented in a number of ways. Examples and context are provided below with reference to the included figures and on going discussion.

First Exemplary Device

Figure 4:
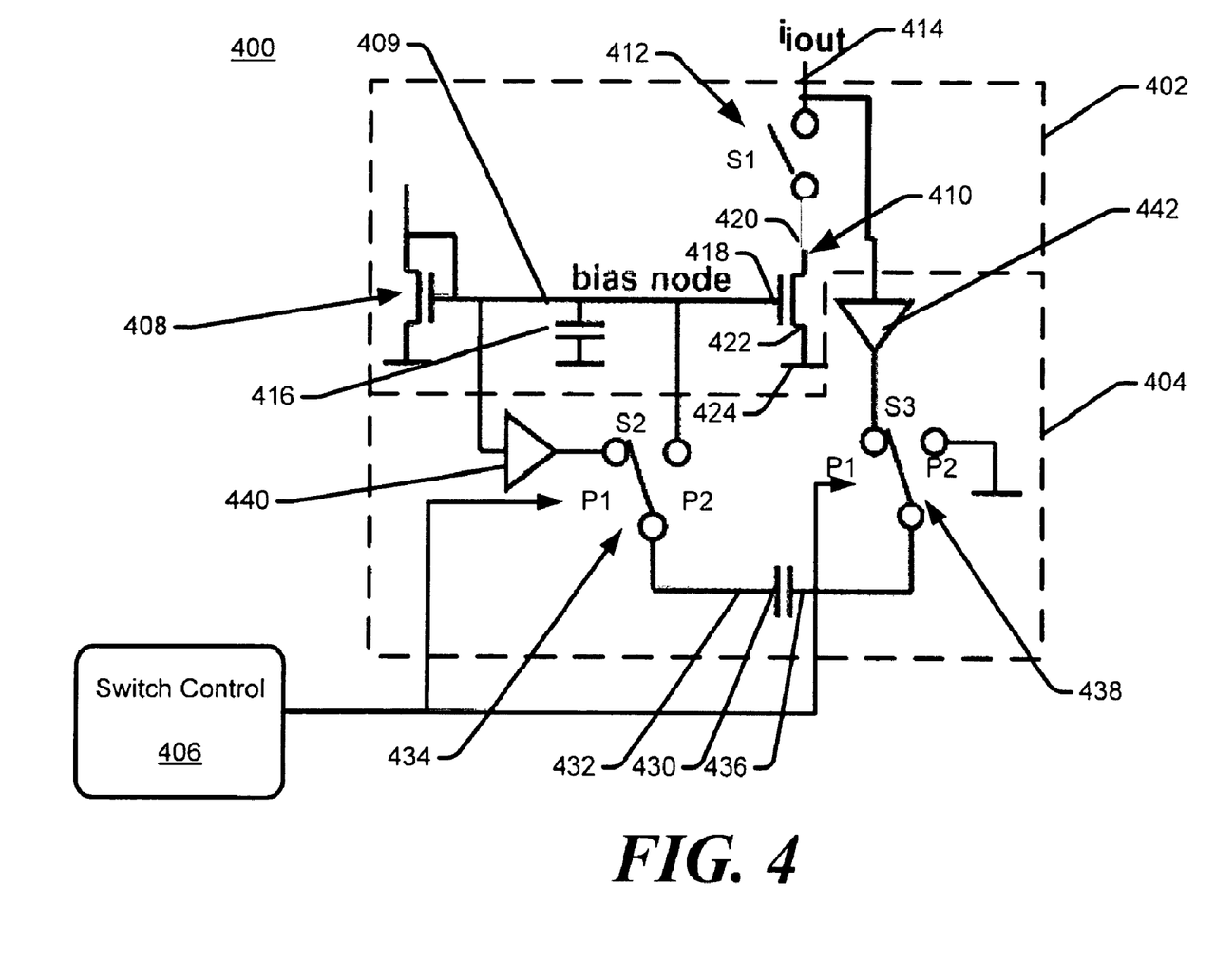
FIG. 4 is a schematic diagram of a current generation cell with a compensation capacitor used in a single ended digital to analog converter circuit.

FIG. 4 illustrates current source cell 400 (current source cells 400 may be used to replace one or more cells 110(a)-110(n) in FIG. 1, which are implemented in the DAC 100) with reduced capacitive coupling effects. Current source cell 400 comprises current source circuit 402 coupled with capacitance circuit 404 that is controlled by switch control circuit 406. Capacitance circuit 404 compensates for capacitance feedback to current source circuit 402 when current source circuit 402 is activated.

Current source circuit 402 comprises a bias transistor 408 coupled via bias node 409 to current source transistor 410. Bias transistor 408 feeds a reference voltage on bias node 409 for current source transistor 410. Transistor 410 is connected via switch S1 412 to output terminal 414 ($i_{out}$) in current source circuit 402. Bias node 409 is coupled to ground through capacitor 416.

In one embodiment, current source transistor 410 may be an FET type transistor with a gate terminal 418 (also referred to herein as a bias node), source terminal 420, and drain terminal 422. Gate terminal 418 has a bias voltage level set by a bias transistor 408. The bias voltage level sets the current level of current source transistor 410. Drain terminal 422 is coupled with ground node 424. Switch S1 412 is connected to source terminal 420. Switch S1 412 opens and closes in response to being selected by selection circuit 108 (FIG. 1). Switch S1 412, may be an FET transistor or any device that does not limit the current being sourced by current source transistor 410.

Capacitance circuit 404 includes capacitor 430 having a power terminal 432 connected to one pole of two pole switch S2 434 and a ground terminal 436 connected to one pole of two pole switch S3 438. Capacitance circuit includes buffer 440 connecting one pole in position P1 of switch S2 434 to bias node 409, and buffer 442 connecting one pole in position P1 of switch S3 438 to output terminal 414. The other pole in position P2 of switch S2 434 is connected directly to bias node 409, and the other pole in position P2 of switch S3 438 is connected to a ground reference voltage.

Figure 6:
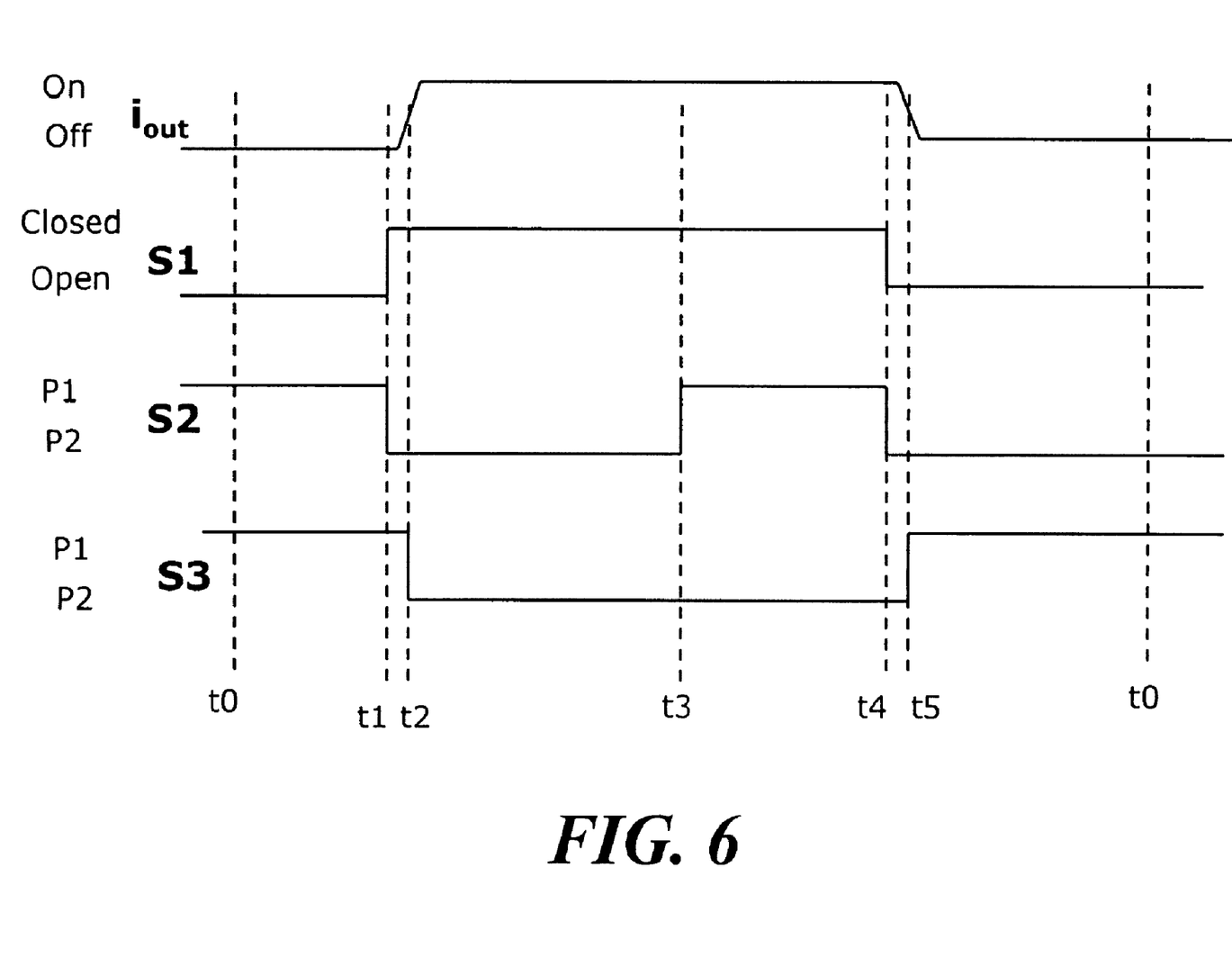
FIG. 6 is a timing diagram to activate a current generation cell in a single ended digital to analog converter circuit in accordance with the invention.

Switch control circuit 406 controls positions P1 and P2 of selection in switch S2 434 and S3 438 respectively in accordance with the timing diagram described in FIG. 6. Switches S2 434 and S3 438, may be a FET transistor or any device that does not limit the current being fed from bias transistor 408 or buffer 440 to capacitor 430, or the current being fed from buffer 442 to capacitor 430.

Although current source cell 400 is shown having one current source circuit 402 and one capacitance circuit 404, this implementation is meant to serve only as a non-limiting example and a fewer number or greater number of current source circuits and capacitance circuits may be used.

Second Exemplary Device

Figure 5:
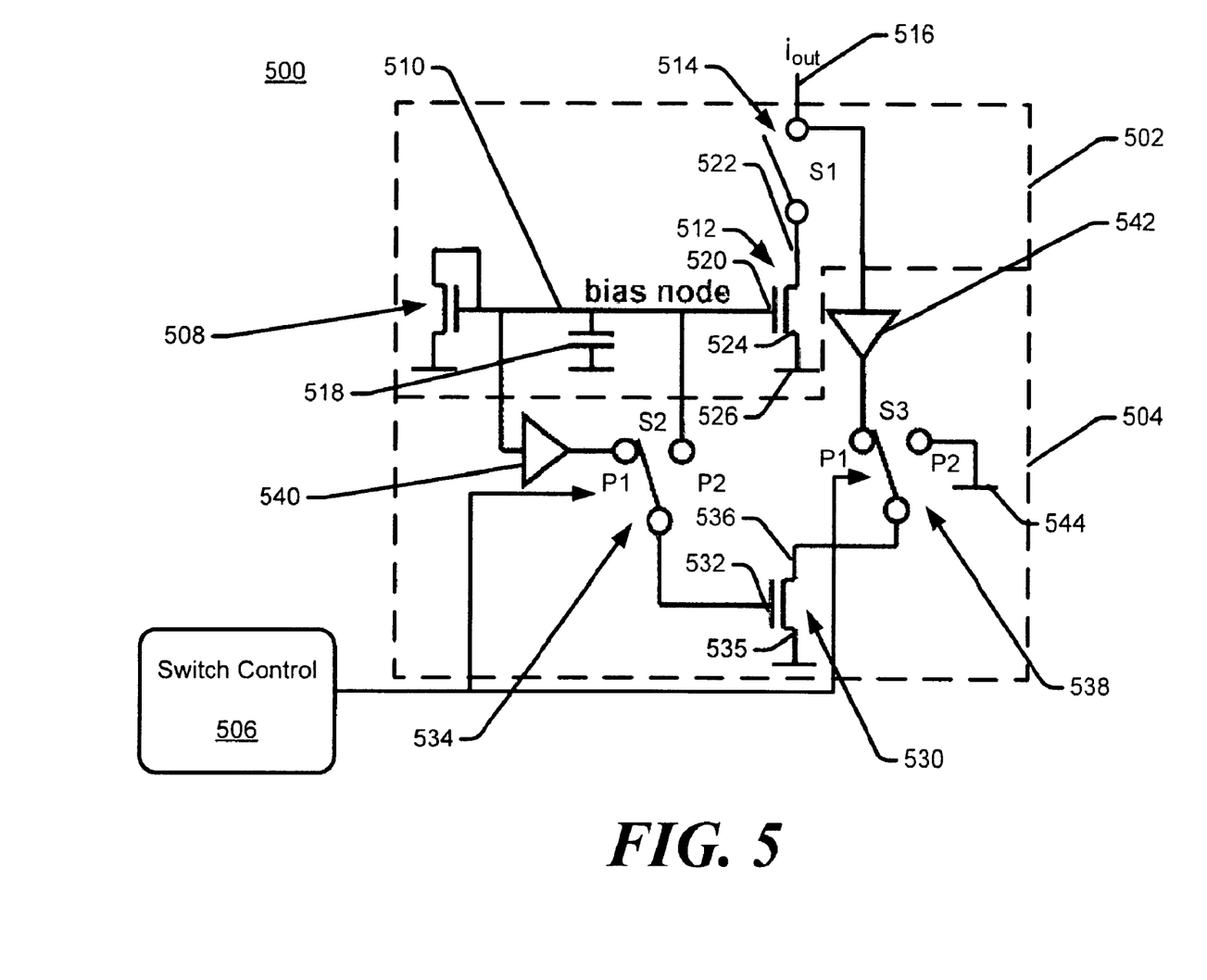
FIG. 5 is a schematic diagram of a current generation cell with a compensation transistor used in a single ended digital to analog converter circuit.

FIG. 5 illustrates another implementation of current source cell 500 (current source cells 500 may be used to replace one or more cells 110(a)-110(n) in FIG. 1, which are implemented in the DAC 100) with reduced capacitive coupling effects. Cell 500 comprises current source circuit 502 coupled with capacitance circuit 504 that is controlled by switch control circuit 506. Capacitance circuit 504 compensates for capacitance feedback to current source circuit 502 by switch control circuit 506 activating switch S2 534 and S3 538 in capacitance circuit 504.

Current source circuit 502 comprises a bias transistor 508 coupled via bias node 510 to current source transistor 512. Bias transistor 508 feeds a reference voltage on bias node 510 for current source transistor 512. Current source transistor 512 is connected via switch S1 514 to output terminal 516 ($i_{out}$) in current source circuit 502. Bias node 510 is coupled to ground through capacitor 518. Current source circuit 502 may be the same circuit as the circuit used in current source circuit 402 described in FIG. 4.

In one embodiment, current source transistor 512 may be an FET type transistor with a gate terminal 520, source terminal 522 and drain terminal 524. Gate terminal 520 has a voltage level set by bias transistor 508. The voltage level also sets the current of current source transistor 512. Drain terminal 524 is coupled with ground node 526. Switch 514 is connected to source terminal 522. Switch 514 opens and closes in response to being selected by selection circuit 108 (FIG. 1). Switch 514, may be another FET transistor or any device that does not limit the current being sourced by current source transistor 512.

Capacitance circuit 504 includes compensation transistor 530 having a gate terminal 532 connected to two pole switch S2 534, a drain terminal 535 coupled to ground, and a source terminal 536 connected to two pole switch S3 538. Capacitance circuit 504 includes buffer 540 connecting one pole in position P1 of switch S2 534 to bias node 510, and buffer 542 connecting one pole in position P2 of switch S3 538 to output terminal 516. The other pole of switch S2 534 is connected directly to bias node 510, and the other pole of switch S3 538 is connected to a ground reference voltage 544. Switch control circuit 506 controls the positions of switch S2 534 and S3 538 in accordance with the timing diagram described in FIG. 6. Switches S2 534 and S3 538 may be a FET transistor or any device that does not limit the current being fed from buffer 540 or bias transistor 508 to compensation transistor 530, or fed from buffer 542 or ground to compensation transistor 530.

Exemplary Timing Diagram

The exemplary timing diagram, shown in FIG. 6, is illustrated as plurality of levels to activate and deactivate the switches using switch control circuit 406 or 506 as respectively depicted in FIGS. 4 and 5.

For discussion purposes, the timing diagrams are described with reference to cell 400 of FIG. 4 or cell 500 of FIG. 5, although it may be implemented in other system architectures. The computer-readable media can be any available media that can be accessed by a computing device to implement the instructions stored thereon.

FIG. 6 shows one example implementation of a timing diagram depicting the voltage levels verses time when switch S1 412, switch S2 434 and switch S3 438 (FIG. 4), or switch S1 514, switch S2 534 and switch S3 538 (FIG. 5) are activated by switch control circuit or selection circuit to compensate for capacitance feedback. Also depicted are the current levels ($i_{out}$) on output terminal 416 or 516 in response to switches (S1-S3) being activated.

At time t0, switch S1 is set to open circuit, switch S2 is set in position P1 to connect the output of buffer 440 to capacitor 430, or the output of buffer 540 to the gate terminal 532 of compensation transistor 530. Switch S3 is set in position P1 to connect the output of buffer 442 to capacitor 430 or connect the output of buffer 542 to source terminal 536, to set the terminal of capacitor 430 or compensation transistor 530 to the potential of output terminal 414 or 516 respectively. Setting switch S2 in position P1 charges capacitor 430 or the gate terminal 532 of the compensation transistor 530 to the bias voltage level. Switch S1 is open at time t0, resulting in no current being provided by the cell 400 or 500 on $i_{out}$.

At time t1 switch S1 (412 or 514) is closed resulting in current ($i_{out}$) being provided to output terminal 414 and 516 respectively. Closing switch S1 results in a voltage jump at terminal 420 or 522, because terminal 420 or 522 is loaded from ground potential to the same voltage as output terminal 414 and 516 respectively. This voltage jump results in an unwanted small voltage jump on bias node 409 or 510. At time t1, switch control circuit 406 or 506 activates switch S2 to change the switch S2 to position to P2. The change in position of switch S2 has no effect on the voltage on the bias node 409 or 510 because the bias nodes voltage level is the same on power terminal 432 or gate terminal 532 before and after the change.

At time t2, switch S3 is changed to position P2 to ground capacitor 430 or ground source terminal 536. In response to the grounding, a voltage jump at node 436 or node 536 respectively is generated, which results in, via the capacitor 430 or compensation transistor 530, a small voltage jump on bias node 409 or 510 in the opposite direction of the voltage jump at node 436 or node 536 at time t1. This small jump compensates for the voltage jump at time t1 so that the potential of bias node 409 or node 510 is at the correct level. After all voltages have settled to their final value, switch S2 is switched to position P1 at time t3.

The sequence of delivering current at the output to delivering no current at the output by opening switch S1 (434 or 534) is shown at time t4 and t5. At time t4 switch S2 is set in position P1 to connect the output of buffer 440 to capacitor 430 or buffer 540 to the gate terminal 532 of compensation transistor 530. Switch S3 (438 or 538) is set in position P2 to ground capacitor 430 or ground source terminal 536. At time t4 S1(434 or 534) is opened resulting in no current ($i_{out}$) being provided to output terminal 414 and 516 respectively. The result is a voltage jump at terminal 420 or 522, because the voltage of terminal 420 or 522 is loaded from the same voltage as output terminal 414 and 516 with respect to ground potential. This voltage jump leads to an unwanted small voltage jump on bias node 409 or 510. At time t4, switch control circuit 406 or 506 activates switch S2 to change the switch to position to P2. The change in position has no effect on the voltage on the bias node 409 or 510 because the voltage level is the same on power terminal 432 and gate terminal 532 before and after the change.

At time t5, switch S3 (438 or 538) is changed to position P1 to connect the output of buffer 442 to capacitor 430 or connect the output of buffer 542 to source terminal 536, to set the terminal of capacitor 430 or compensation transistor 530 to the potential of output terminal 414 or 516 respectively. A voltage jump at node 436 or 536 respectively is generated, which causes via the capacitor 430 or compensation transistor 530, a small voltage jump on bias node 409 or 510 in the opposite direction of the voltage jump at this node 409 or 510 at time t4. This compensates for the voltage jump at node 436 or 536 at time t4 and biases bias node 409 or 510 respectively to the correct level.

Exemplary Process

Figure 7:
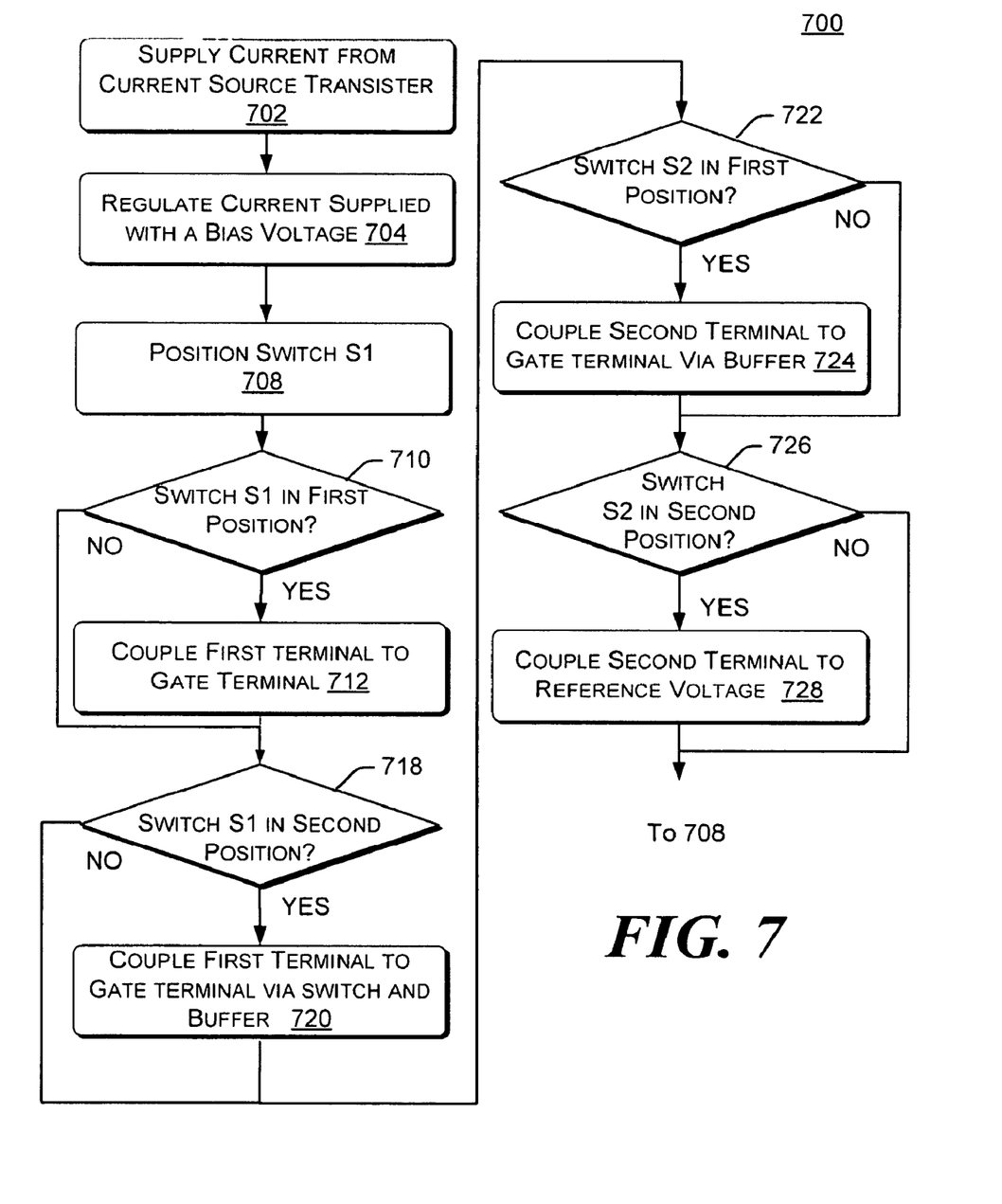
FIG. 7 illustrates a flow diagram of an exemplary process for compensating for nonlinearity of DACs.

The exemplary process in FIG. 7 is illustrated as a collection of blocks in a logical flow diagram, which represents a sequence of operations that can be implemented in hardware, software, and a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. For discussion purposes, the processes are described with reference to system 400 of FIG. 4 or system 500 of FIG. 5, although it may be implemented in other system architectures.

FIG. 7 illustrates a flow diagram 700 of an exemplary process for compensating for nonlinearity of single ended digital to analog converters. In block 702, current is supplied from the current source transistor to the output terminal. In block 704, the supplied current is regulated with a bias voltage.

In blocks 708-728, capacitance feed back on a gate terminal 418 of the current source transistor 410 or 512 is compensated when the current source transistor 410 or 512 respectively selectively supplies current to the output terminal 414 or 516 using switch control 406 or 506 with current source circuit 402 or 502 respectively. In block 708 switch S1 is positioned in an open or first position, or alternatively switch s1 is positioned in a closed or second position depending on whether current is needed to be supplied from the current source transistor 410 or 512 to the output terminal 414 or 516 respectively.

In block 710 a determination is made whether switch S1 is in the first position. If it is, then the first terminal of a capacitor 430 or transistor 530 is coupled to the gate terminal of the current source transistor using switch S2 in block 712. If the first terminal of a capacitor 430 or transistor 530 is not, then a determination is made in block 718 whether switch S1 is in a second position. If switch S1 is in a second position, then in block 720, the first terminal of capacitor 430 or transistor 530 is coupled to the gate terminal 418 or 520 via switch s3 and the buffer 440. If switch S1 is not in the second position, a determination is made whether switch s2 is in a first position in block 722. If switch s2 is, the second terminal 436 of the capacitor 430 or transistor 530 is coupled to the output terminal 414 or 516 respectively via switch s3 and buffer 442 or 542 in block 724. If Switch S1 is not in the first position, a determination is made in block 726 whether switch S2 is in a second position. If switch S2 is in the second position, the second terminal of the capacitor 430 or transistor 530 is coupled to the reference voltage (ground) via switch s3 in block 728. If switch S2 is not in the second position, the process of compensating for capacitance feedback repeats in block 708 by positioning or re-positioning switch S1.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims.

The invention claimed is:

1. An apparatus, comprising:
   at least one cell including an output terminal, a transistor, a circuit and a switch, said transistor including a gate terminal with a bias voltage and a source terminal, said switch coupling the output terminal to the source terminal; and
   the circuit being coupled with the output terminal and the gate terminal to compensate for capacitance feedback between the gate terminal and the source terminal when the switch is activated.

2. The apparatus as recited in claim 1, wherein the circuit comprises:
   a capacitor with a first and second terminal; and
   a first and second switch each having a first and second position, said first switch being coupled with said first terminal and said second switch being coupled with said second terminal.

3. The apparatus as recited in claim 2, wherein said first terminal is coupled through the first switch to the gate terminal when the first switch is in the first position and is coupled through the switch and a buffer to the gate terminal when the first switch is in the second position, wherein said second terminal is coupled though a buffer to the output terminal when the second switch is in the first position, and wherein said second terminal coupled to a reference voltage when the second switch is in the second position.

4. The apparatus as recited in claim 3, further comprising a second circuit to generate a signal to connect the first switch and second switch to their second positions respectively prior to the switch being activated to compensate for capacitive feedback over the gate of the transistor.

5. The apparatus as recited in claim 4, wherein the second circuit generates a signal to connect the first switch and the second switch to their first position after the switch is activated to charge the capacitor.

6. The apparatus as recited in claim 1, wherein the circuit comprises:
   a compensation transistor with a gate, source and drain terminal; and
   a first and second switch each having a first and second position, said first switch being coupled with a gate terminal of said compensation transistor and said second switch being coupled with said compensation transistor source terminal.

7. A device, comprising:
   an output terminal;
   a transistor coupled via a switch to the output terminal, said transistor including a gate terminal with a bias voltage and a source terminal, said switch coupling the output terminal to the source terminal; and
   a circuit coupled with the output terminal and the gate terminal to compensate for capacitance feedback between the gate terminal and the source terminal when the switch is activated.

8. The device as recited in claim 7, wherein the circuit comprises:
   a capacitor with a first and second terminal; and
   a first and second switch each having a first and second position, said first switch being coupled with said first terminal and said second switch being coupled with said second terminal.

9. The device as recited in claim 8, wherein said first terminal is electrically connected through the first switch to the gate terminal when the first switch is in the first position and is connected through the switch and a buffer to the gate terminal when the first switch is in the second position, wherein said second terminal is electrically connected though a buffer to the output terminal when the second switch is in the first position, and wherein said second terminal is electrically connected to a reference voltage when the second switch is in the second position.

10. The device as recited in claim 7, wherein the circuit comprises:
    a compensation transistor with a gate, source and drain terminal; and
    a first and second switch each having a first and second position, said first switch being coupled with the compensation transistor gate terminal and said second switch being coupled with the compensation transistor source terminal.

11. A method, comprising:
    selectively supplying current from a transistor to an output terminal;
    regulating the current supplied by the transistor with a bias voltage; and
    compensating for capacitance feedback on a gate terminal of the transistor when the transistor supplies current to the output terminal.

12. The method as recited in claim 11, wherein the capacitance feedback is compensated by coupling a capacitance circuit to the transistor.

13. The method as recited in claim 12, wherein the capacitance circuit is coupled between a source terminal and a gate terminal of the current source transistor.

14. The method as recited in claim 13, wherein the capacitance circuit includes a capacitor coupled in series between the output terminal and the gate terminal.

15. The method as recited in claim 13, wherein the capacitance circuit includes a second transistor, the second transistor including source terminal coupled with the source output terminal of the transistor and a gate terminal coupled with the gate terminal of the transistor.

16. The method as recited in claim 12, wherein the circuit comprises:
    a capacitor with a first and second terminal; and
    a first and second switch, each switch having a first and second position, the first switch being coupled with said first terminal and the second switch being coupled with said second terminal.

17. The method as recited in claim 16, wherein compensating for capacitance feedback comprises:
    positioning the first switch in the first position or the second position;
    coupling said first terminal via the first switch to the gate terminal when the first switch is positioned in the first position;
    coupling said first terminal through the switch and a buffer to the gate terminal when the first switch is in the second position;
    coupling said second terminal though a buffer to the output terminal when the second switch is in the first position; and
    coupling said second terminal to a reference voltage when the second switch is in the second position.

* * * * *